United States Patent [19]

Yasuda et al.

[11] Patent Number: 4,980,567
[45] Date of Patent: Dec. 25, 1990

[54] CHARGED PARTICLE BEAM EXPOSURE SYSTEM USING LINE BEAMS

[75] Inventors: Hiroshi Yasuda, Yokohama; Junichi Kai, Tokyo; Toyotaka Kataoka; Yasushi Takahashi, both of Kawasaki; Shinji Miyaki, Tokushima; Kiichi Sakamoto, Tokyo, all of Japan

[73] Assignee: Fujitsu Limited, Kawasaki, Japan

[21] Appl. No.: 329,833

[22] Filed: Mar. 28, 1989

[30] Foreign Application Priority Data

| Mar. 30, 1988 | [JP] | Japan | 63-074792 |
| May 2, 1988 | [JP] | Japan | 63-107582 |
| Jun. 20, 1988 | [JP] | Japan | 63-151877 |
| Aug. 18, 1988 | [JP] | Japan | 63-206164 |

[51] Int. Cl.$^5$ ............................................. H01J 37/30
[52] U.S. Cl. .................................. 250/398; 250/396 R; 250/492.2
[58] Field of Search ........... 250/396 R, 398, 396 ML, 250/492.2

[56] References Cited

U.S. PATENT DOCUMENTS

| 4,130,761 | 12/1978 | Matsuda et al. | 250/398 |
| 4,200,794 | 4/1980 | Newberry et al. | 250/396 ML |
| 4,409,487 | 10/1983 | Kuschel et al. | 250/398 |
| 4,472,636 | 9/1984 | Hahn | 250/398 |
| 4,633,090 | 12/1986 | Hahn | 250/398 |
| 4,724,328 | 2/1988 | Lischke | 250/398 |
| 4,742,234 | 5/1988 | Feldman | 250/398 |

Primary Examiner—Bruce C. Anderson
Attorney, Agent, or Firm—Staas & Halsey

[57] ABSTRACT

In a charged particle beam exposure system, a line of individual blanking apertures ($39_0$ to $39_{255}$) is provided to form a line of beams which are individually blanked and unblanked by applying voltages to electrodes within the blanking apertures.

12 Claims, 22 Drawing Sheets

MAIN FIELD    SUB FIELD 4,980,567

CHARGED PARTICLE BEAM EXPOSURE SYSTEM USING LINE BEAMS

BACKGROUND OF THE INVENTION (1) Field of the Invention

The present invention relates to a charged particle beam exposure system such as an electron beam exposure system using a line of individual blanking apertures.

(2) Description of the Related Art

Recently, direct exposure lithography for large scale integrated circuits (LSI's), i.e., electron beam exposure lithography without masks has been broadly developed. Such electron exposure lithography often uses a variable shaped beam such as a variable rectangular beam to enhance the throughput of an electron beam exposure system.

However, as the fine configuration of LSI's develops, variable shaped beam exposure systems have the following disadvantages, particularly in the production of LSIs having line widths in the order of 0.2 to 0.3 $\mu$m:

(1) There is an upper limit to the current densities that can be achieved by using variable shaped beams.

(2) In order to project LSI pattern requiring a large number of shots, the number of driver (DAC/AMP) adjustments necessary for main deflectios, a sub deflections and a beam size deflection must be increased, thus increasing wasted time. Therefore, variable shaped beam exposure systems are not adapted to the mass production of fine patterns consisting of 0.2 to 0.3 $\mu$m lines.

(3) A shaped beam having a width of 0.2 to 0.3 $\mu$m is too small, to be practical since such a shaped beam is the same as a point beam which has no merit.

(4) Since variable shaped beams are generally formed by superimposing two separate masks, the doses of small beam such as those having a width 0.2 to 0.3 $\mu$m are all relatively unstable.

SUMMARY OF THE INVENTION

An object of the present invention is to provide a charged particle beam exposure system adapted to an ultra-fine configuration of LSIs having a line width less than 0.2 to 0.3 $\mu$m, and which is stable at high speeds and has a high degree of precision.

According to the present invention, in a charged particle beam exposure system, a line of individual blanking apertures is provided to form a line of beams which are individually blanked and unblanked by applying voltages to the electrodes within the blanking apertures.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before the description of the preferred embodiment, a prior art variable shaped beam exposure system will be explained with reference to FIGS. 1 and 2.

Figure 1:
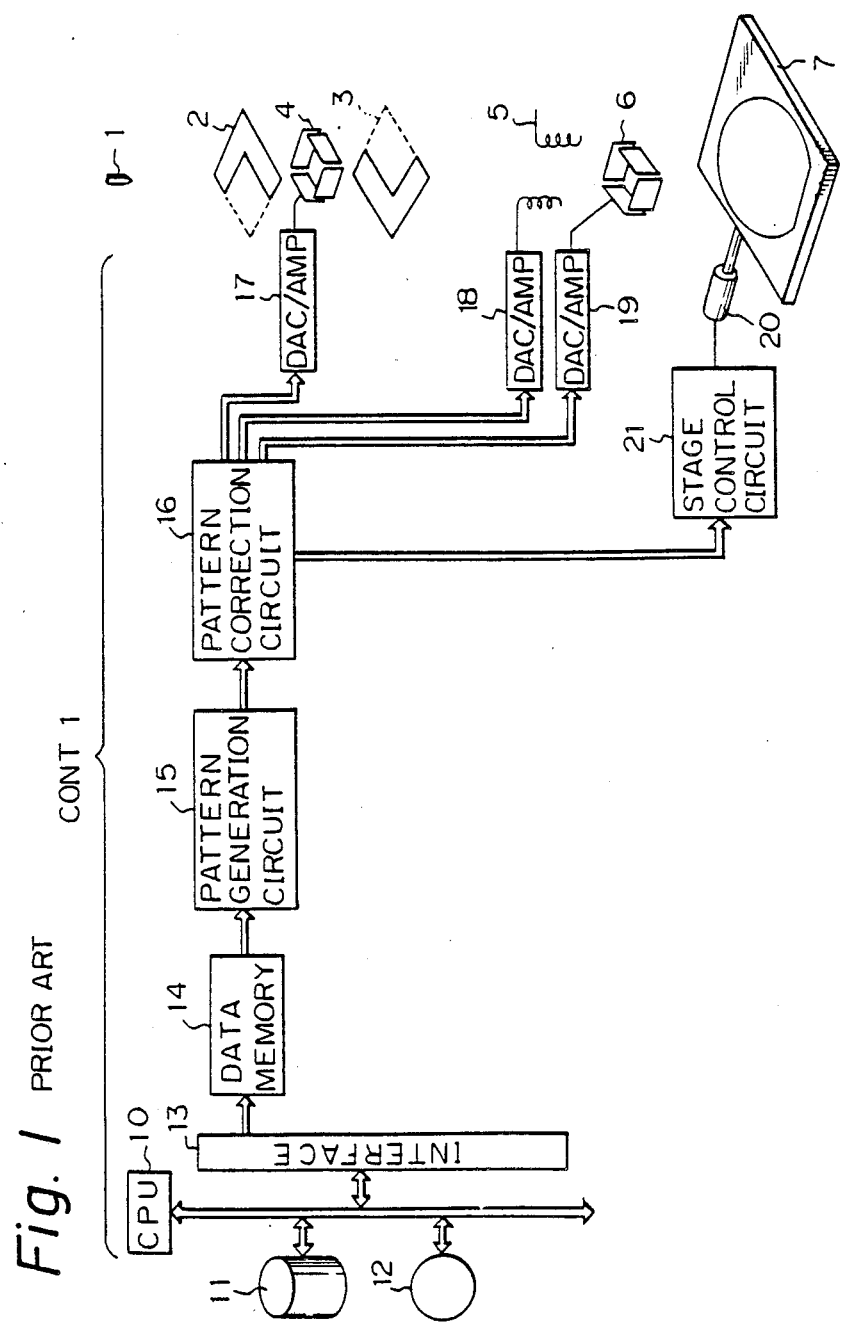
FIG. 1 is a diagram illustrating a prior art variable shaped beam exposure system.

FIG. 1 illustrates a prior art variable shaped beam exposure system wherein the system is comprised of an electron gun 1, two slits 2 and 3 providing a rectangular aperture, beam size deflection electrodes 4 for deflecting the rectangular beam to change its cross section, a main deflection lens (coils) 5, and a sub deflection lens (electrodes) 6, for projecting a voluntary rectangular beam on a target such as a wafer mounted on a piece base 7. A control portion CONT 1 for controlling the foregoing elements is comprised of a central processing unit (CPU) 10, a magnetic disk 11 for storing data, a magnetic tape 12 for storing data, an interface 13, a data memory 14, a pattern generation circuit (shot decomposition) 15, and a pattern correction circuit 16 for making the necessary corrections. The control portion is also comprised of drivers (DAC/AMP) 17, 18, and 19 for driving the beam size deflection electrodes 4, the main deflection coils 5, and the sub deflection electrodes 6, and a stage control circuit 21 for controlling a motor 20 for moving the piece base 7.

Figure 2:
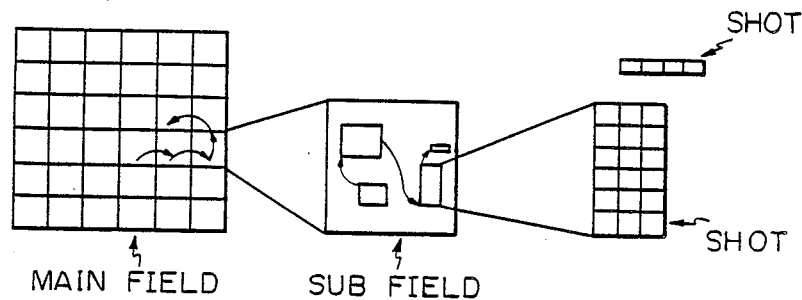
FIG. 2 is a diagram explaining prior art variable shaped beam exposure systems.

In a variable shaped beam exposure as illustrated in FIG. 2, data is transmitted from the magnetic disk 11 or the magnetic tape 12 to the data memory 14 corresponding to the entire area of a main field. This main field is divided into a plurality of sub fields, and each sub field is further divided into a plurality of shots (rectangular patterns). In this case, the deflection of an electron beam between the sub fields within one main field is carried out by the main deflection coils 5, the deflection of an electron beam between the rectangular patterns within a sub field is carried out by the sub deflection electrodes 6, and the adjustment of the magnitude of a rectangular pattern is carried out by the beam size deflection electrodes 4.

The variable shaped beam exposure system of FIG. 1, however, has the problems discussed above.

Figure 4A:
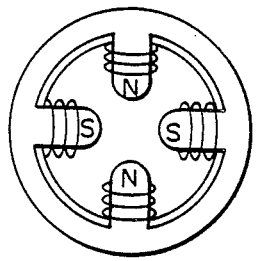
FIGS. 4A and 4B are diagrams showing examples of 4-pole beam flattening lens systems.
Figure 4B:
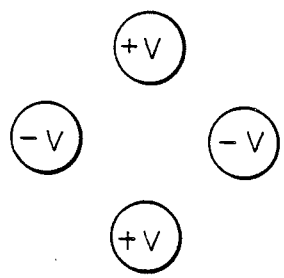
Figure 3:
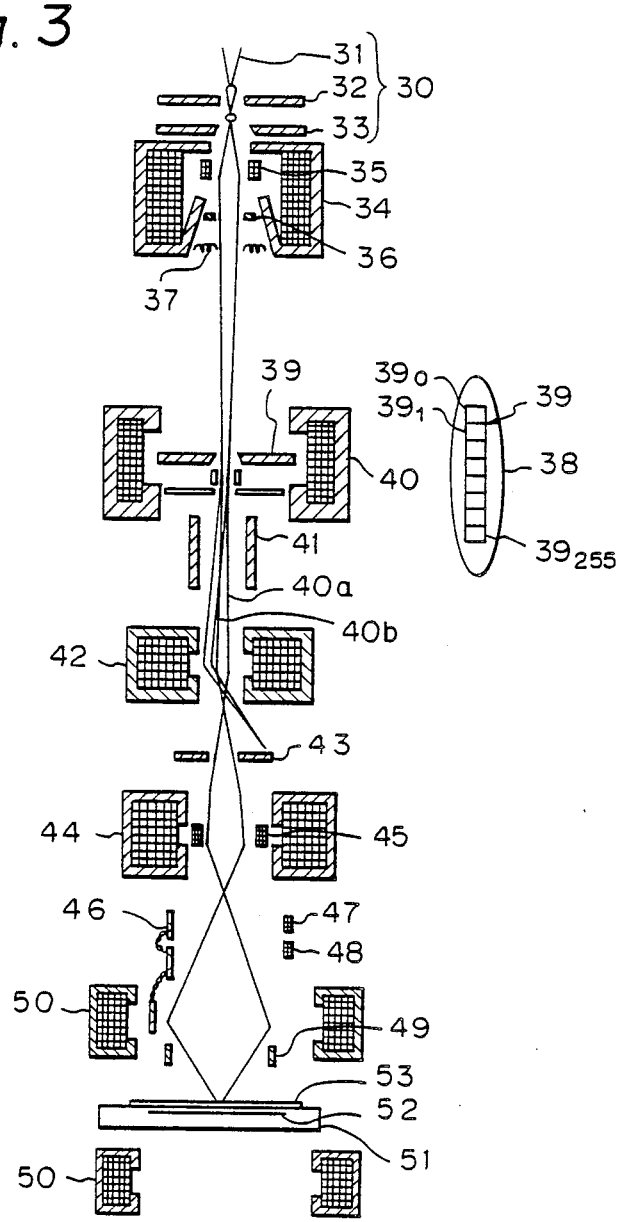
FIG. 3 is a diagram illustrating an embodiment of the charged particle beam exposure system according to a present invention.

In FIG. 3, which illustrates an embodiment of the charged particle beam exposure apparatus according to the present invention, reference numeral 30 designates an electron gun formed by cathode 31, a grid 32, and an anode 33. A beam generated from the cathode 31 forms a crossover between the grid 32 and the anode 33. This crossover is magnified by a crossover magnifying lens 34, which comprises a 4-pole beam flattening lens 35, a limiting a 36 and an alignment coil 37. The 4-pole beam flattening lens 35 may be a magnetic lens as illustrated in FIG. 4A or an electrostatic lens as illustrated in FIG. 4B. As a result, a flattened crossover image 38 is formed at the blanking aperture array 39. Note that the 4-pole beam flattening lens 35 is unnecessary if the electron gun 30 itself generates a flattened crossover beam.

Provided in the blanking aperture array 39 is a line of 256 blanking apertures $39_0$ to $39_{255}$ having a square of 5 $\mu$m. That is, the blanking apertures $39_0$ to $39_{255}$ form a so-called harmonica shape. For example, the blanking aperture array 39 may be made of monocrystalline silicon, trench etching may be performed on the monocrystalline silicon to obtain apertures, and then electrodes may be formed on the inner walls thereof, as will be explained later in detail. Also, the blanking aperture array 39 may be provided within a converging lens 40. Note that two series of blanking apertures $39_0$ to $39_{255}$ can also be provided.

When a voltage is not applied to the electrodes of a blanking aperture, such as $39_0$, a beam, which is formed by a part of the flattened crossover image beam, passes straight through the blanking aperture $39_0$. In such case the beam is called an ON-beam 40a. Contrary to this, if a voltage is applied to the electrodes of the blanking aperture $39_0$, the above-mentioned beam passes obliquely through the blanking aperture $39_0$. In the case, this beam is called an OFF-beam 40b.

Reference numeral 41 designates a large blanker which turns ON and OFF all of the individual beams which have passed through the blanking apertures $39_0$ to $39_{255}$. That is to say, when the large blanker 41 is turned OFF, the ON-beams 40a pass through demagnifying lens 42 and also pass through a blanking aperture 43, while the OFF-beam 40b passes through the demagnifying lens 42, but does not pass through the blanking aperture 43. Contrary to this, when the large blanker 41 is turned ON, all the individual beams, including ON-beams and OFF-beams, are stopped by the blanking aperture 43.

The beams which have passed through the blanking aperture 43 then pass through a demagnifying lens 44 and an immersion type lens 50 to form a 1/100 demagnified image of the blanking aperture array 39 on a wafer 53. The wafer 53 is held by suction on an electrostatic chuck 52 carried by a continuous motion stage 51.

Provided in the demagnifying lens 44 is a refocus coil 45. A refocus current dependent upon the number of ON-beams passing through the blanking aperture array 39 is supplied to the refocus coil 45, to correct any blurring of the ON-beams due to the Coulomb Interaction, thus improving the sharpness of the ON-beams.

Reference numeral 46 designates a traverse scanning deflector which scans the beam in a direction perpendicular to the direction of motion of the continuous motion stage 51. Also, a dynamic focus coil 47 and a dynamic stigmatic coil 48 correct any blurring of deflection of a beam with respect to the traverse scanning direction. That is, the dynamic focus coil 47 and the dynamic stigmatic coil 48 are required when deflection of the beam is large and the beam is thus far removed from the optical axis.

Reference numeral 49 designates an 8-pole deflector which corrects deflection distortion, carries out the feedback of the continuous motion of the stage 51 and corrects the speed thereof.

The continuous motion stage 51 is provided within the immersion type lens 50 to enhance the resolution of the beam.

Figure 5:
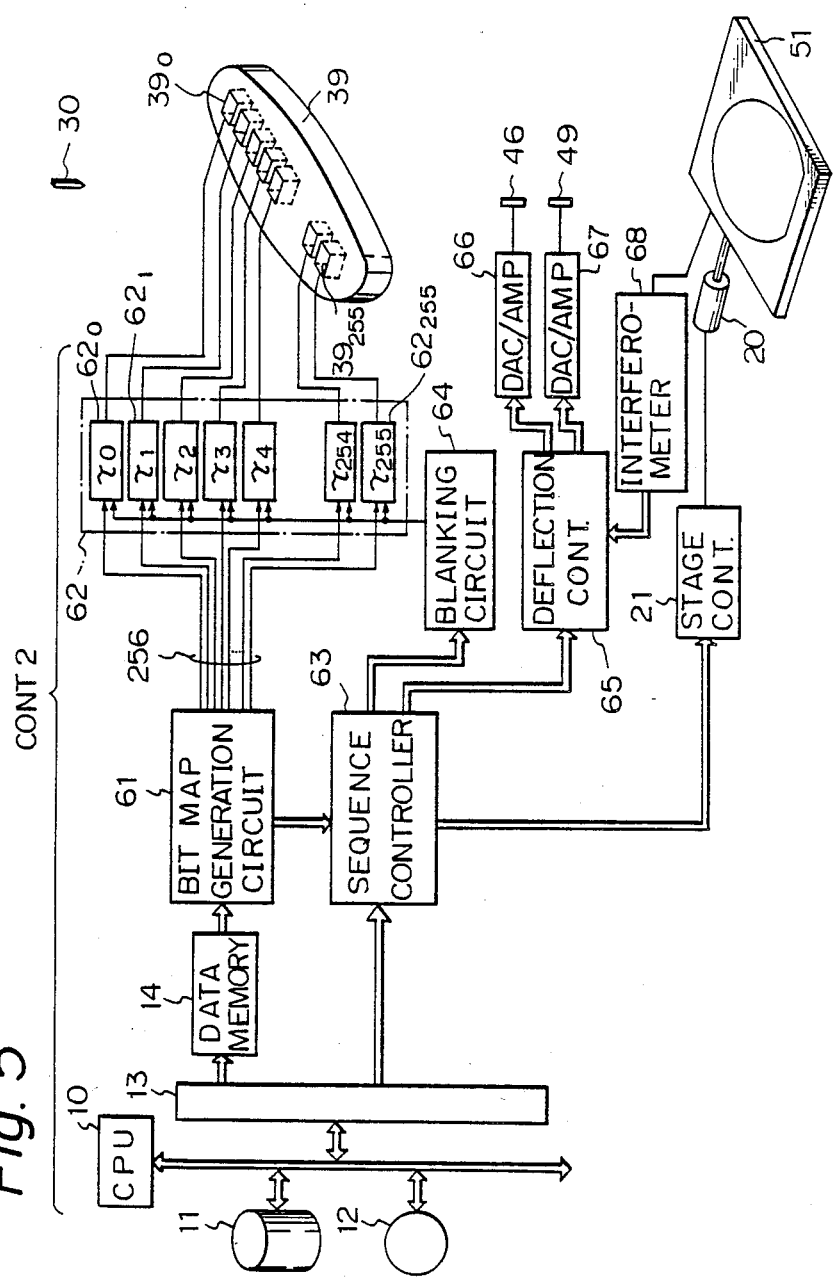
FIG. 5 is a block diagram of an example of a control portion for the system of FIG. 3.

In FIG. 5, which illustrates a control portion CONT 2 for controlling the principal elements of FIG. 3, the elements which are the same as those of FIG. 3, are identified by the same reference numerals. However instead of the pattern generation circuit 15, the pattern correction circuit 16, and the drivers (DAC/AMP) 17, 18, and 19 of FIG. 1 CONT 2 includes a bit map generation circuit 61, a blanking generation circuit 62, a sequence controller 63, a blanking control circuit 64, a deflection control circuit 65, drivers (DAC/AMP) 66 and 67, a laser interferrometer 68.

The bit map generation circuit 61 reads information (256 bits) for one line of beams from the data memory 14 and transmits it to the blanking generation circuit 62. As a result, the electrodes of the apertures $39_0$ to $39_{255}$ of the blanking aperture array 39 are independently turned ON and OFF. Note that the strengths $I_i$ of the beams passing through the respective apertures are different from each other, and are dependent on the location thereof. Accordingly, the respective ON-durations $\tau_0$, $\tau_1$, . . . and $\tau_{255}$, corresponding to the location of each respective aperture $39_0$, $39_1$, . . . , and $39_{255}$ is set in the corresponding respective circuit $62_0$, $62_1$, . . . , and $62_{255}$, as will be later explained.

The blanking control circuit 64 initiates the circuits $62_0$, $62_1$, . . . , and $62_{255}$ of the blanking generation circuit 62 at timings in accordance with indication signals of the sequence controller 63.

Figure 6:
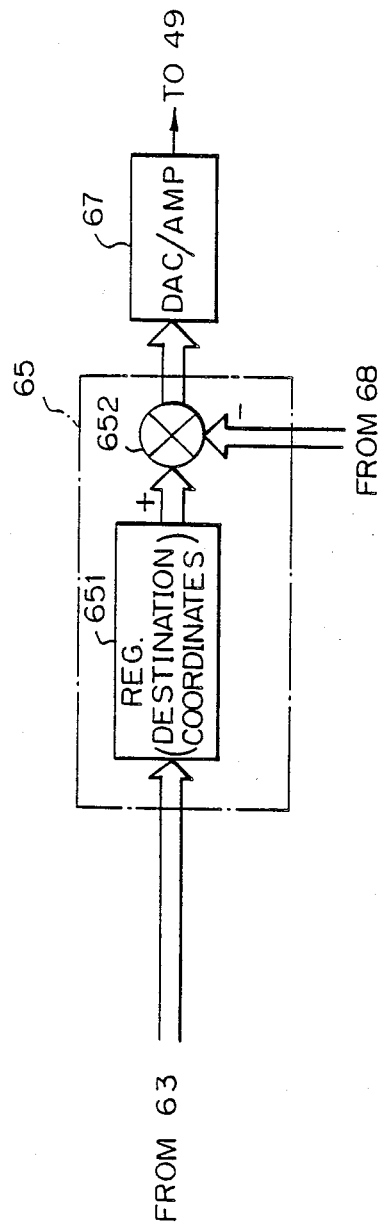
FIG. 6 is a block diagram of the deflection control circuit of FIG. 5.

The deflection control circuit 65 drives the traverse scanning deflector 46 by using the driver 66 in accordance with a traverse coordinate of line beam information generated from the bit map generation circuit 61. Also, in this case, the stage 51 is continuously moved by the stage control circuit 21. Therefore, it is necessary to carry out the feedback control of the location of a line of beams due to the continuous motion of the stage 51. For this purpose, the deflection control circuit 65 drives the 8-pole deflector 49 so that the difference between the location of the stage 51 as detected by the laser interferometer 68 and a destinated location is zero. That is, as illustrated in FIG. 6, the deflection control circuit 65 is comprised of a register 651 storing the designated location (X, Y) from the sequence controller 63, and a difference calculator 652 for calculating the difference between the feedback location information (X,, Y,) from the laser interferometer 58 and the register 61, thereby controlling the 8-pole deflector 49. Thus, the feedback of an error in the opposite of stage 51 is carried out at a high speed. Note that, in actuality, the 8-pole deflector 49 adjusts the location of the line of beams in two dimensions, but, only one-dimensional location adjustment is illustrated in FIGS. 5 and 6 to simplify the illustration.

Figure 7:
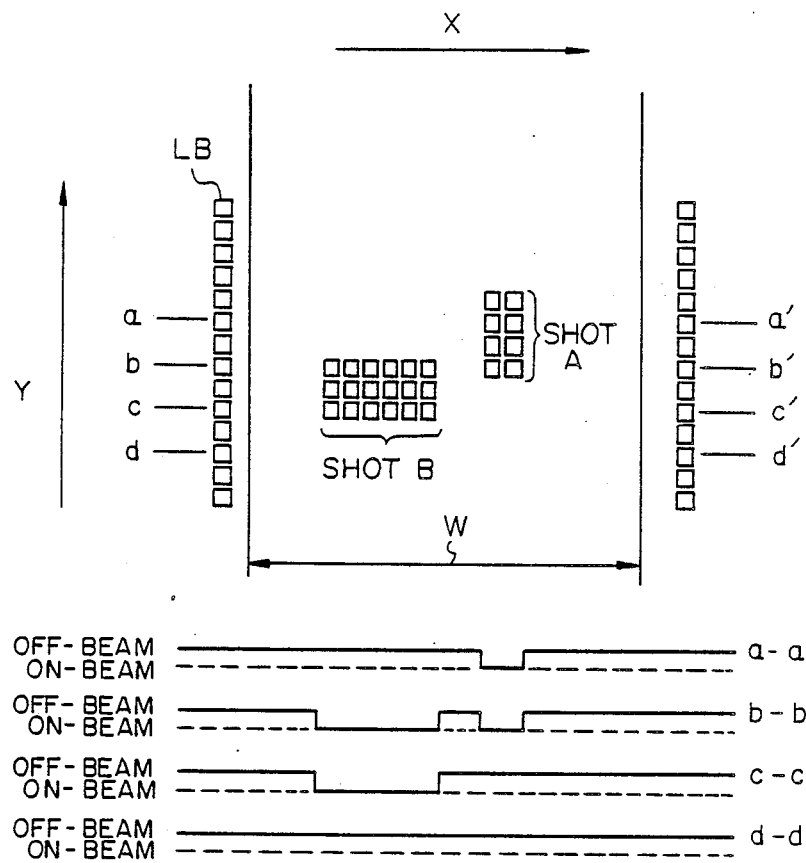
FIG. 7 is a diagram explaining the operation of control portion of FIG. 5.

The operation of the control portion CONT 2 of FIG. 5 is explained with reference to FIG. 7 in which a line of beams LB is moved along a direction X perpendicular to the direction of motion Y of stage 51. The electrodes of the blanking apertures $39_0$ to $39_{255}$ are individually turned ON and OFF. For shots A and B to be exposed in FIG. 7, blanking voltages a—a', b—b', c—c', d—d' are applied to the electrodes of the blanking aperture array 39. Note, as explained above, that when a blanking voltage is applied to the electrodes of a given blanking aperture, a beam which passes therethrough is an OFF-beam, and when no blanking voltage is applied to the electrodes of a given blanking aperture, a beam which passes therethrough is an ON-beam.

The blanking generation circuit 62 is now explained with reference to FIGS. 8 8C, and 9.

Figure 8A:
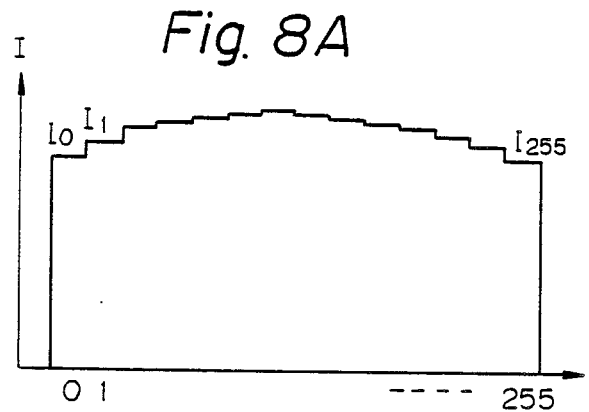
FIGS. 8A, 8B, and 8C are graphs showing the beam strength, beam ON-pulse time period, and beam dose of the apertures of the blanking aperture array of FIG. 5.
Figure 8B:
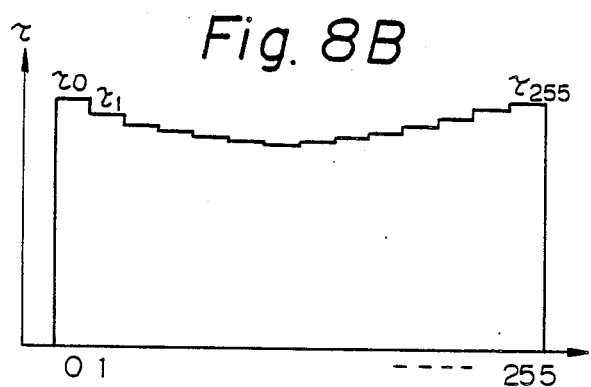

That is, a crossover beam is flattened in a critical exposure, however, the beam strengths $I_0, I_1, \ldots,$ and $I_{255}$ at the apertures (cells $39_0$ to $39_{255}$ of the blanking aperture array 39 have a uniformity of only 80 to 90% as illustrated in FIG. 8A. For this purpose, as illustrated in FIG. 8B, the respective beam ON-pulse durations $\tau_0, \tau_1, \ldots,$ and 255 are inversely proportional to the respective intensity $I_0, I_1, \ldots,$ and $I_{255},$ of FIG. 8A. That is, $$\tau_i \times I_i = \text{a constant}$$

Figure 8C:
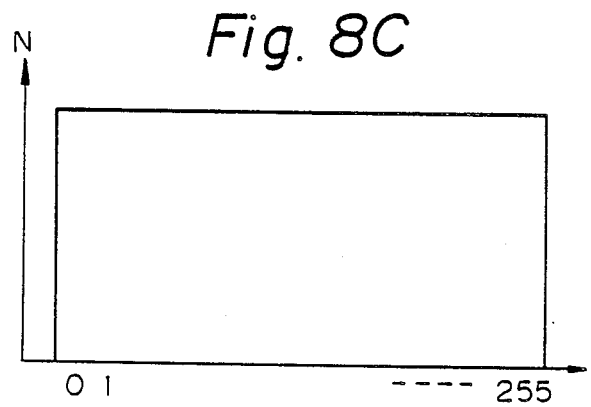

As a result, the respective doses of each of a line of beams is definite as illustrated in FIG. 8C. For this purpose, each of the circuits $62_i$ of the blanking generation circuit 62 is constructed as illustrated in FIG. 9.

Figure 9:
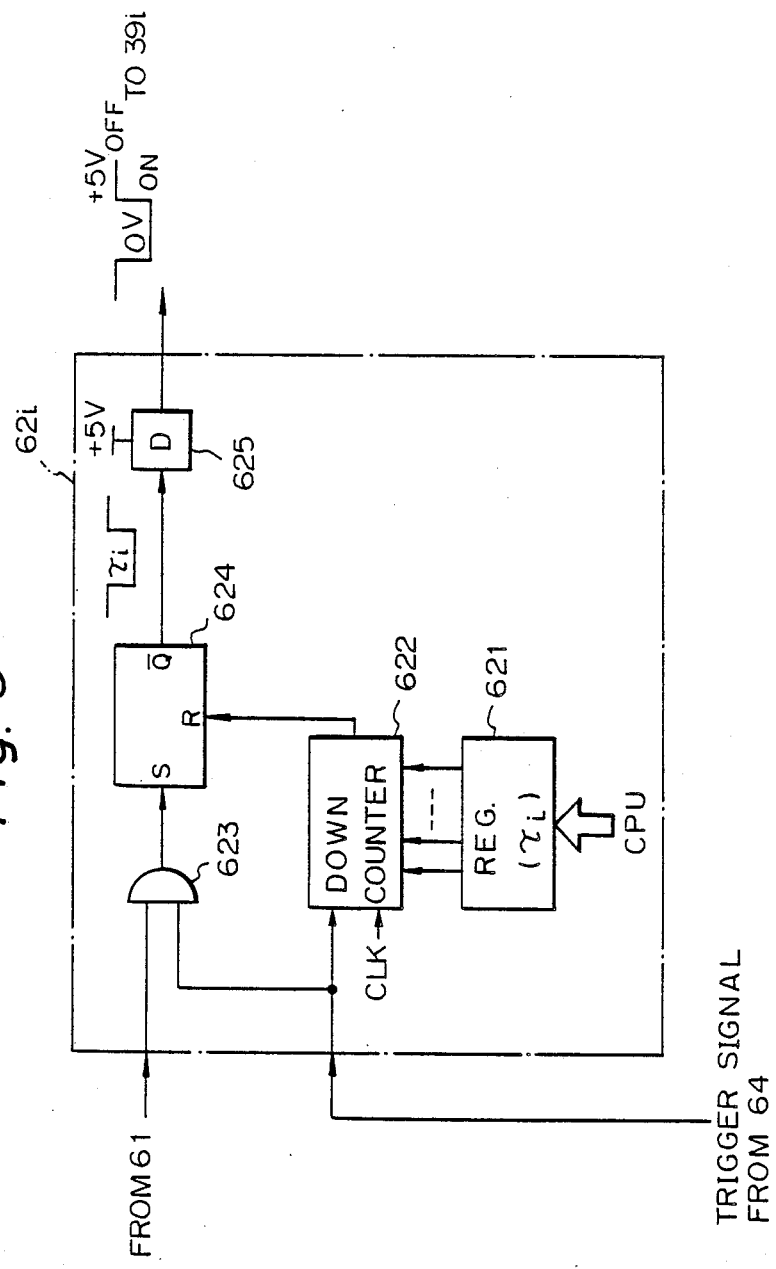
FIG. 9 is a block circuit diagram for the blanking generating circuit of FIG. 5.

In FIG. 9, reference numeral 621 designates a register for storing the duration $\tau_i$ of a beam ON-pulse; numeral 622 designates a down counter, numeral 623 designates an AND circuit, numeral 624 designates a flip-flop, and numeral 625 designates a driver. That is, when data from the bit map generation circuit 61 is "1" and a trigger pulse is supplied from the blanking control circuit 64, the flip-flop 624 is set so that the output pulse at the terminal $\overline{Q}$ falls to disable the electrode of the corresponding blanking aperture $39_i$. Simultaneously, the trigger pulse from the blanking control circuit 54 sets the value $\tau_i$ of the register 621 in the down counter 622. The down counter 622 counts a high speed clock signal CLK and decreases the value thereof.

When the value of the down counter 622 reaches 0, that is, when a time corresponding to $\tau_i$ has passed, the down counter 622 generates a borrow-out signal which serves as a reset signal for the flip-flop 624. As a result, the flip-flop 624 is reset, and the electrodes of the blanking aperture $39_i$ are turned ON. from course, when data of the bit map generation circuit 61 is "0", the flip-flop 624 is not set, and accordingly, a driving pulse $\tau_i$ (negative pulse) is not generated.

Thus, each of the circuits $62_i$ generates a driving pulse of a definite voltage such as 5 V having a time period corresponding to $\tau_i$, which is determined in advance in accordance with the data of the bit map generation circuit 61. It is to be noted that, the value $\tau_i$ of the register 621 can be set in advance, or can be altered by the CPU 10 as occasion demands.

In the above-mentioned system of FIG. 3 using the control portion CONT 2 of FIG. 5, however, when a ultrafine pattern is depicted, a problem due to the proximity effect may occur. Here, the proximity effect occurs when an exposure pattern is in very close proximity to another exposure pattern and the two exposure patterns are affected by each other, to increase the effective sensitivity of the resist, and thus increase the size of the pattern. Generally, such proximity effect may be overcome by selecting a suitable exposure dose for exposure shots, or by correcting the size of the patterns as follows:

(1) For each shaped exposure shot (pattern), an exposure dose is determined in accordance with a designated residual film rate of negaresist, or an exposure dose is determined to obtain a perpendicular cross-sectional shape of posiresist. This is called an exposure dose correction method.

(2) As electrons moved through the resist, they are scattered by interaction with the atoms of the resist, so as to spread the paths of travel of the electrons. Also, the travel paths of the electrons spread due to the large mass of the substrate. Further, the size of a pattern is spread by reflection of electrons from the substrate. In order to avoid this, the actual exposure size is reduced as compared with the design size. This is called a self-shift of pattern size.

(3) When two or more exposure shots are very close to each other, the exposure for one exposure shot may be superimposed on the exposure of another exposure shot due to the reflection of electrons. As a result, the actual exposure size may be enlarged, and a resolution failure may occur between two or more shots. In order to avoid this, the actual exposure sizes of the shot are reduced as compared with the design size. This is called a mutual shift of a pattern size.

(4) Between a plurality of rectangular shots connected to each other, exposure is shortened due to the reduction in the temperature. In order to avoid this, a double exposure is carried out. This is called a size extension correction.

In relatively large exposure shots, correction may be carried out using only the above-mentioned size shift, but as the pattern size becomes ultra-fine, correction by size shift is not sufficient.

Incidentally, in prior art variable rectangular beam systems, since the beam is stationary at the wafer, the time period of the stationary beam may be changed to easily control the exposure dose. As a result, the beam size may be adjusted by a deflector, thereby adjusting the exposure area of the wafer. In the above-mentioned system of FIGS. 5 and 7, however, since the beams are not stationary, the exposure doses cannot be adjusted by the above-mentioned general methods.

Figure 10:
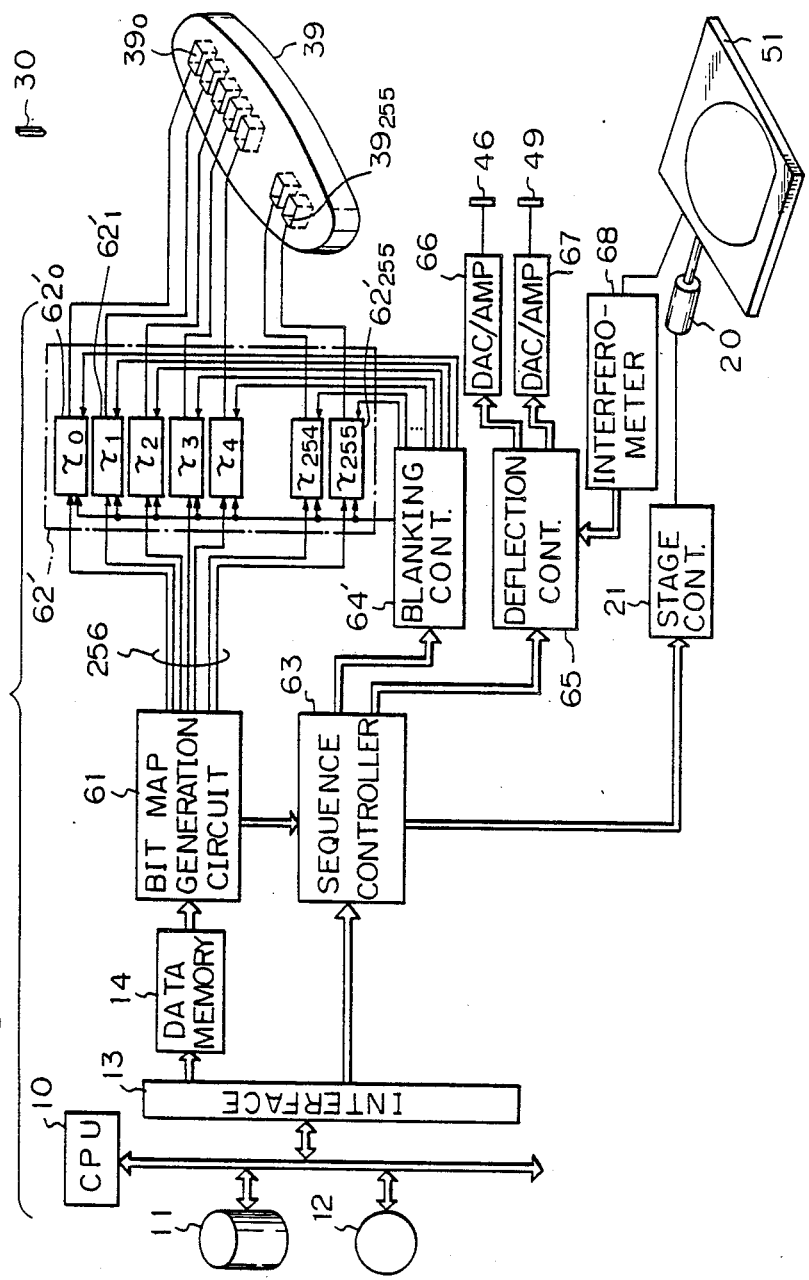
FIG. 10 is a block diagram of another example of a control portion for FIG. 3.
Figure 11:
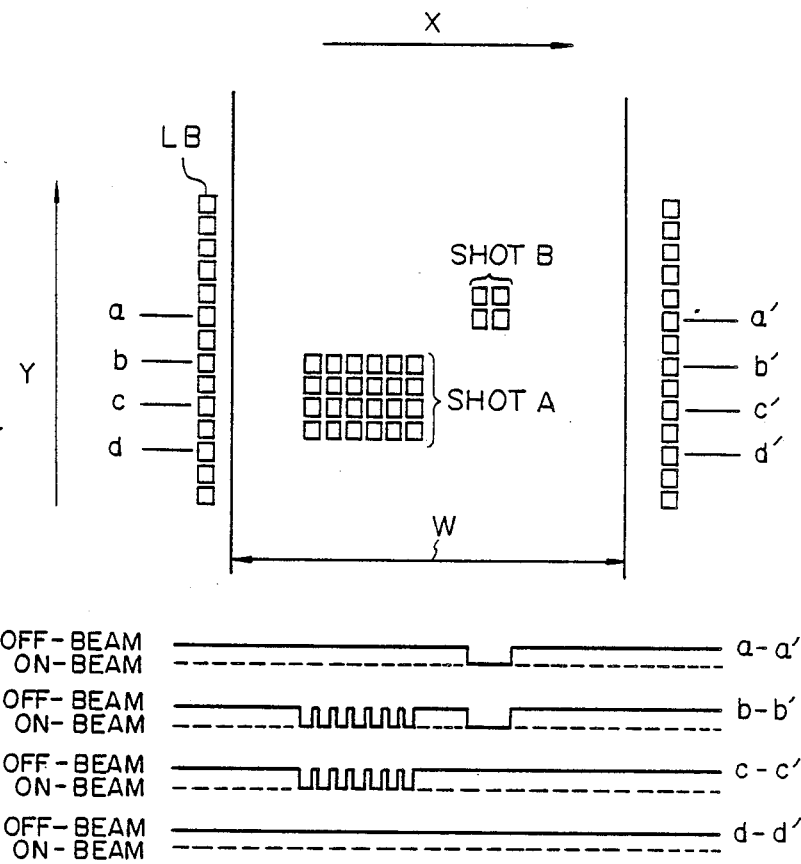
FIG. 11 is a diagram explaining the operation of the control portion of FIG. 10.
Figure 12A:
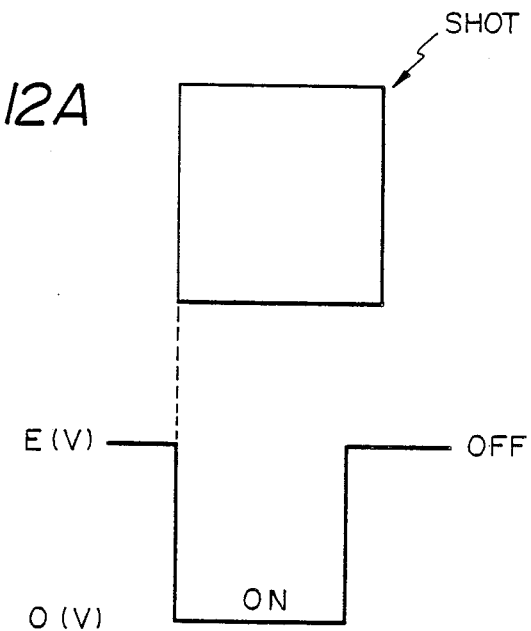
FIGS. 12A and 12B are diagrams explaining the adjustment of beam dose in the control portion of FIG. 10.
Figure 12B:
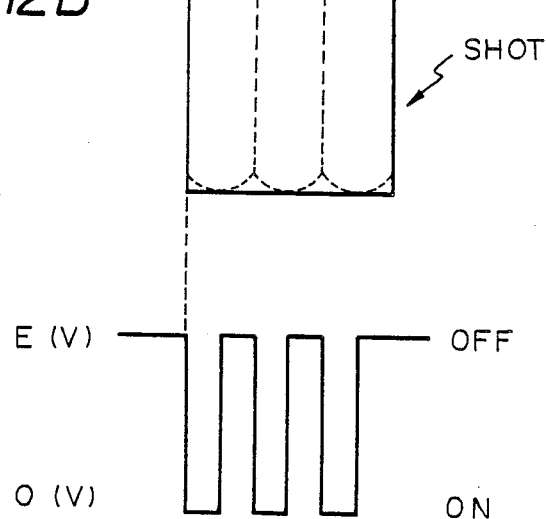
Figure 13:
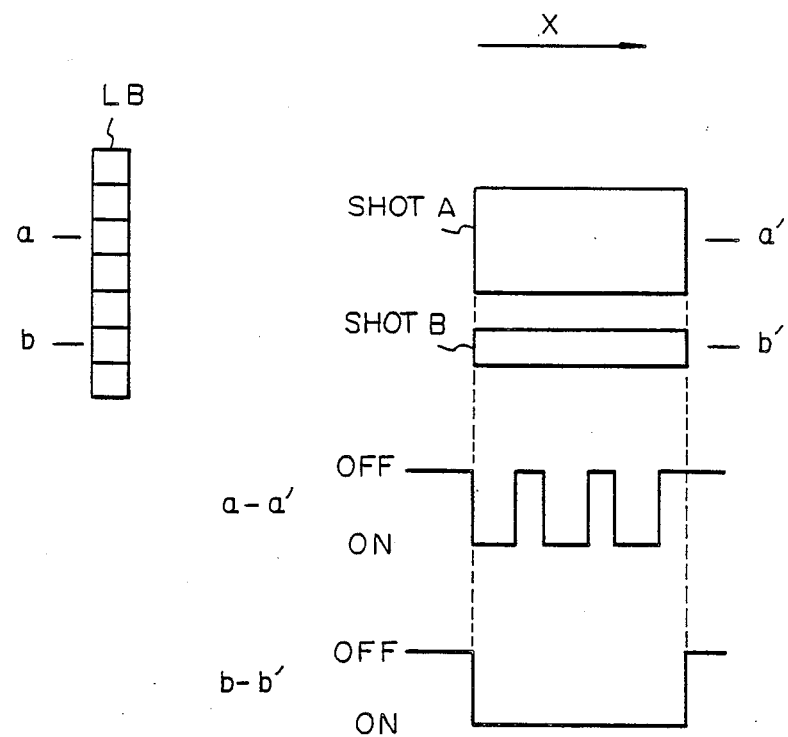
FIG. 13 is a diagram explaining the adjustment of beam dose according to shots in the control portion of FIG. 10.

In order to easily adjust the exposure dose, the control portion CONT 2 of FIG. 5 is modified as illustrated in FIG. 10. In a control portion CONT 3 of FIG. 10, the blanking generation circuit 62 and the blanking control circuit 64 of FIG. 5 are modified as indicated at reference numerals 62' and 64'. The operation of the control portion CONT 3 is explained with reference to FIG. 11 which is similar to FIG. 7. That is, the duty ratio of an ON beam signal of a blanking signal is controlled in accordance with the magnitude of an exposure shot. For example, in a large exposure area such as A, the duty-ratio of an ON-beam signal is small, while, in a small exposure area such as shot B, the duty ratio of an ON-beam signal is large (in FIG. 11, 100%). In more detail, if a blanking signal having an ON-duty ratio of 100% at a definite deflection speed is applied for a shot as illustrated in FIG. 12A, a maximum exposure dose is obtained. On the other hand, if the ON-duty ratio of the blanking signal at the same deflection speed is reduced as illustrated in FIG. 12B, a reduced exposure dose is obtained. In this case, the ON-duty ratio of a blanking signal for each element of a line of beams is changed in accordance with the area of a shot. For example, as illustrated in FIG. 13, the ON-duty ratio is 60% for a large shot A, and the ON-duty ratio is 100% for a small shot, thereby removing the proximity effect. Note that the smaller repetition period of a duty ratio creates a finer exposure dose.

Thus, the adjustment of an exposure amount is carried out without changing the deflection speed.

Also, ON-duty ratios $D_R$ for each element of a line of beams are calculated in advance and are stored in the data memory 14. Based upon this, the bit map generation circuit 61 transmits ON-duty ratio data $D_R$ to the sequence controller 63. As a result, the blanking control circuit 64' transmits duty ratio data $D_R$ to the circuits $62_0'$, $62_1'$, ..., and $62_{255}'$. the circuitry illustrated in FIGS. 14A and 14B is common to each of the circuits $62_0'$, $62_1'$, ..., and $62_{255}'$.

Figure 14A:
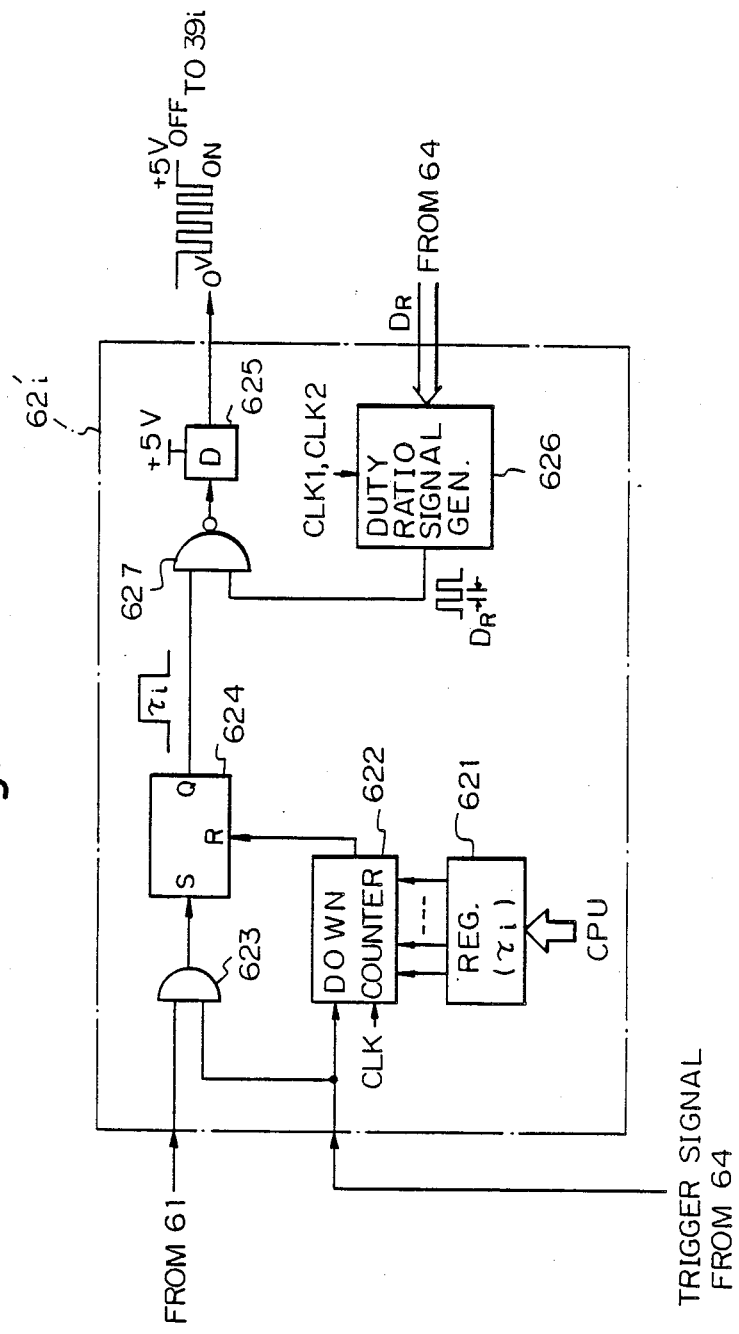
FIG. 14A is a block circuit diagram of the blanking generating circuit of FIG. 10.
Figure 14B:
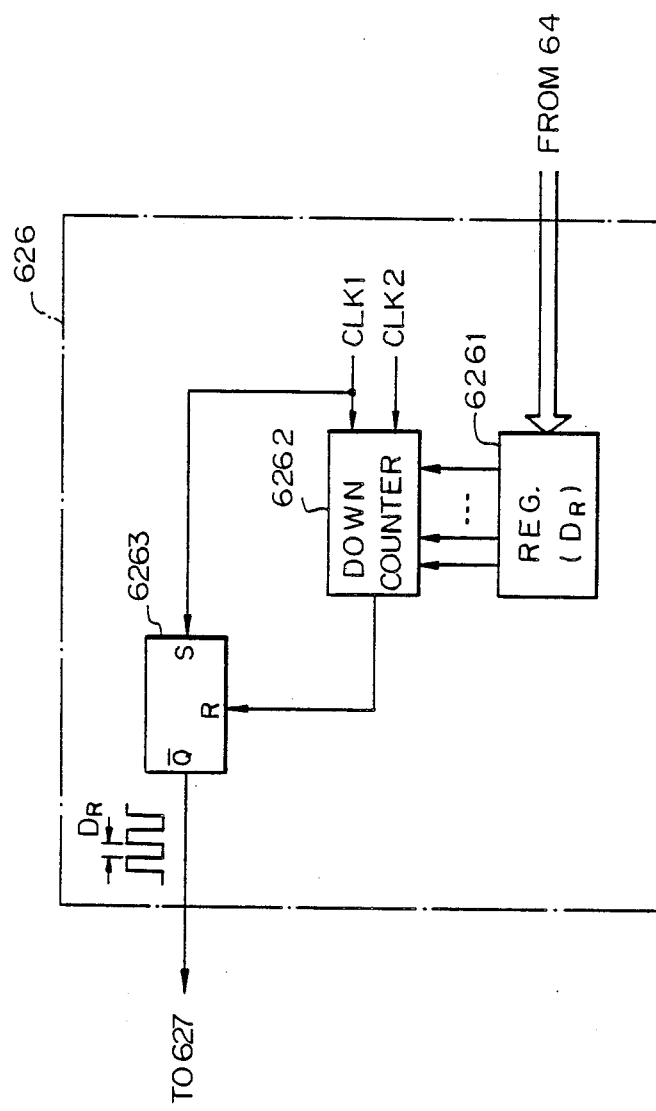
FIG. 14B is a detailed block diagram of the duty ratio signal generation circuit of FIG. 14A.

In FIG. 14A, a duty ratio signal generation circuit 626 and a NAND circuit 627 are added to the elements of FIG. 9. Also, as illustrated in FIG. 14B, the duty ratio signal generation circuit 626 is comprised of a register 6261, a down counter 6262, and a flip-flop 6263. That is, the duty ratio data $D_R$ is set in the register 6261 by the blanking control circuit 64'. When a trigger pulse clock signal CLK1, which has a relatively low definite frequency, is supplied to the flip-flop 6263, the flip-flop 6263 is set so that the output $\overline{Q}$ thereof is "0". Simultaneously, the trigger pulse clock signal CLK1 sets the duty ratio data $D_4$ of the register 6261 in the down counter 6262. The down counter 6262 counts a high speed clock signal CLK2 and decreases the value thereof. When the value of the down counter 6262 reaches 0, i.e., when a time corresponding to $D_R$ has passed, the down counter 6262 generates a borrow-out signal which serves as a reset signal. As a result, the flip-flop 6263 is reset. Thus, the flip-flop 6263 generates a duty ratio signal having a duty ratio $D_R$.

Returning to FIG. 14A, the output Q of the NAND circuit 624 and the duty ratio signal of the duty ratio signal generation circuit 626 are supplied to the NAND circuit 627, and also, the output of the NAND circuit 627 is supplied to the driver 625. As a result, the driver 625 generates a signal having an OFF level (5 V) and an ON level (0 V) which also has a duty ratio of $D_R$, as illustrated in FIG. 14A.

Figure 15:
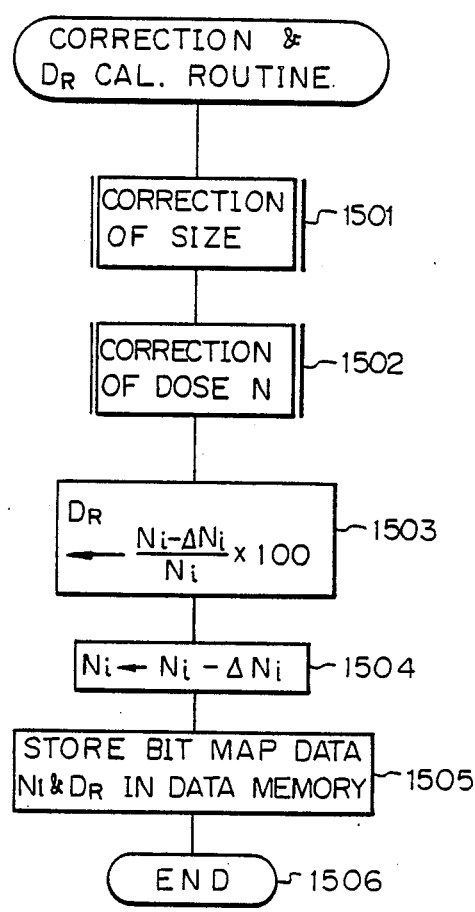
FIG. 15 is a flow chart showing the operation of the CPU of FIG. 10.

The calculation of the duty ratio $D_R$ is explained by the routine as illustrated in FIG. 15. That is, at step 1501, the CPU 10 carries out various corrections of each pattern (shot) such as a self-shift of a pattern size, a mutual shift of a pattern size, a size extension correction, and the like, as explained above, to make bit map data. Then, at step 1502, the CPU 10 corrects the exposure dose $N_i$ for each element (i = 0, 1, 2, ...). In this case, as explained above, the CPU 10 calculates an area of a shot to which each element belongs, and calculates a correction value $\Delta N_i$ in accordance with the area. Of course, other corrections can be introduced, as occasion demands. Then, at step 1503, the CPU 10 calculates a duty ratio $D_R$ for each element by $$D_R \leftarrow \frac{N_i - \Delta N_i}{N_i} \times 100 \ (\%)$$

Then, at step 1504, the CPU 10 corrects the base exposure dose $N_i$ by $$N_i \leftarrow N_i - \Delta N_i$$

At step 1504, the CPU 10 stores depiction information in the data memory 14 as indicated below.

| $(X_i, Y_i)$ | BIT MAP DATA | DOSE $(N_i)$ | DUTY RATIO $(D_R)$ |
|---|---|---|---|
| $(X_0, Y_0)$ | "0" | 0 | 0 |
| $(X_0, Y_1)$ | "1" | $N_1$ | 50% |
| . | . | . | . |
| . | . | . | . |
| . | . | . | . |
| $(X_1, Y_0)$ | "1" | $N_i$ | 70% |
| $(X_1, Y_1)$ | "1" | $N_{i+1}$ | 80% |
| . | . | . | . |
| . | . | . | . |

Thus, the routine of FIG. 15 is completed.

Figure 16:
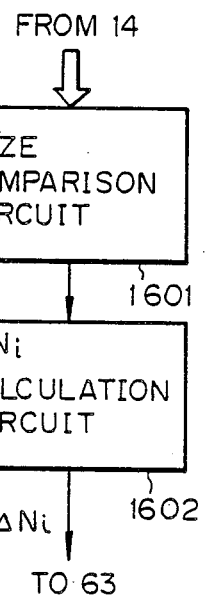
FIG. 16 is a block diagram of a modification of FIG. 10.

Note that the duty ratio $D_R$ can be calculated by hardware as illustrated in FIG. 16. For this purpose, a size comparison circuit 1601 and a dose correction calculation circuit 1602 are added to the elements of FIG. 10. That is, the size comparison circuit 1601 compares a pattern size of each element with a predetermined value. Upon receipt of the output of the size comparison circuit 1601, which shows the pattern size of each element, the dose correction calculation circuit 1602 calculates a correction value $\Delta N_i$ in accordance with the pattern size of each element, and transmits it via the sequence controller 63 to the blanking control circuit 64'. As a result, the blanking control circuit 64' calculates a duty-ratio $D_R$ in accordance with the correction value $\Delta N_i$.

Figure 17A:
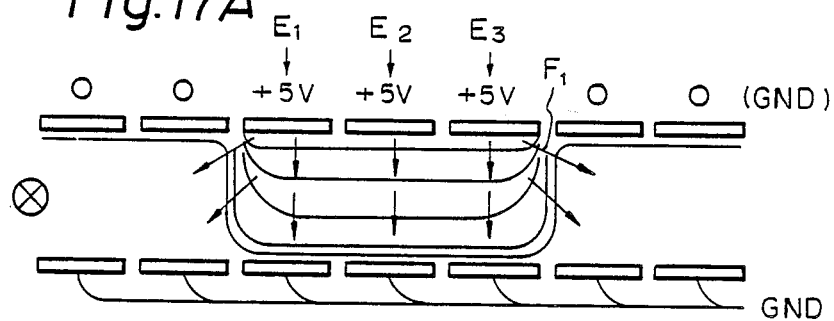
FIGS. 17A and 17B are diagrams explaining problems in line beam exposure according to the present invention.
Figure 17B:
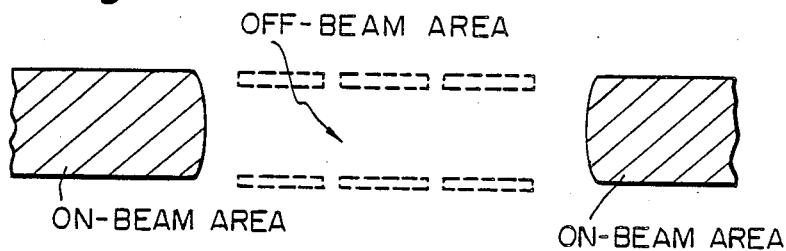

In FIG. 17A, a voltage of 5 V is applied to the electrodes of three successive blanking apertures $E_1$, $E_2$, and $E_3$, and as a result, equipotential lines appear and, accordingly, lines of electric force perpendicular thereto appear as indicated by arrows $F_1$. As a result, as illustrated in FIG. 17B, the OFF-beam area is increased, while ON-beam areas are decreased, due to the strong electric force on the outer sides of the OFF-beam area. This also reduces the size of the exposure pattern.

Figure 18A:
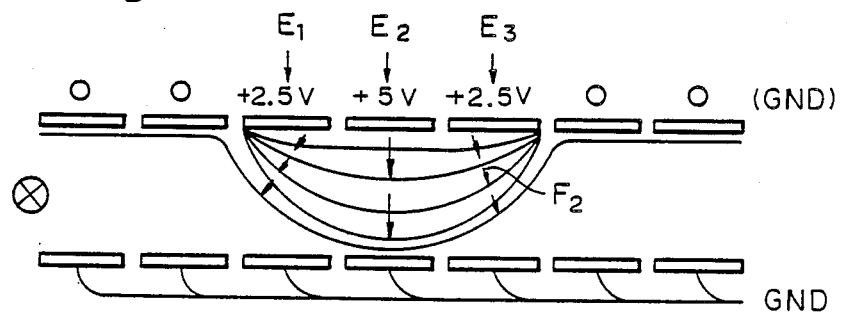
FIGS. 18A and 18B are diagrams explaining the improvement of FIGS. 17A and 17B.
Figure 18B:
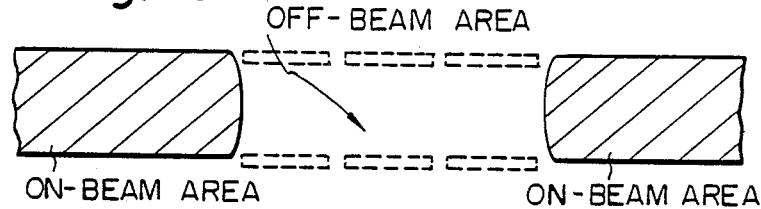

Contrary to the above, in FIG. 18A, a voltage of 5 V is applied to the electrodes of the control blanking aperture $E_2$ and a voltage of 2.5 V is applied to the electrodes of the outer side blanking apertures $E_1$ and $E_3$, and as a result, equipotential lines appear and, accordingly, lines of electric force perpendicular thereto on the outer sides of the blanking apertures $E_2$ are weakened as indicated by arrows $F_2$. As a result, as illustrated in FIG. 18B, the OFF-beam area is decreased, while ON-beam areas are increased. This is helpful in improving the accuracy of an exposure pattern.

Figure 19:
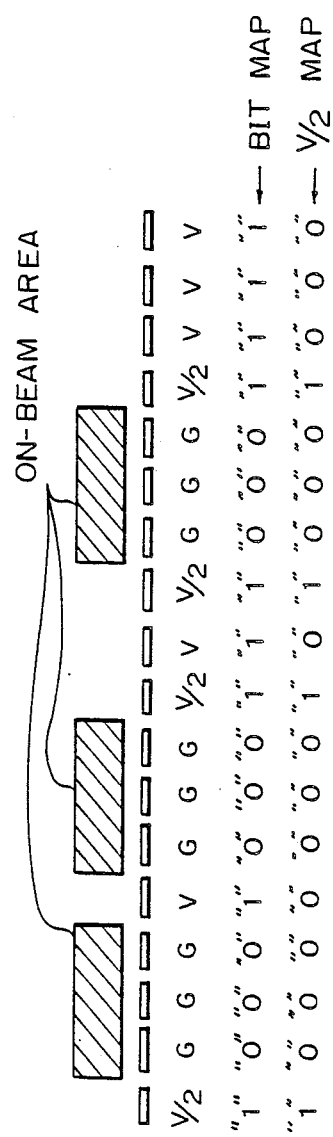
FIG. 19 is a diagram explaining an example of voltages applied to the apertures of FIG. 3.

More generally, as illustrated in FIG. 19, in an OFF-beam area, a voltage of "V/2" (=2.5 V) is applied to the electrodes of the blanking apertures on the outer sides thereof, and a voltage of "V" (=5 V) is applied to the electrodes of the other blanking apertures. On the other hand, in an On-beam area, no voltage is applied to the electrodes of the blanking apertures. In order to achieve this, V/2 map data as illustrated in FIG. 19 is calculated from the bit map data. For example, $$A_i \leftarrow (B_{i-1} \oplus B_i) + (B_i \oplus B_{i+1})$$

wherein
$A_i$ is i-th V/2 map data;
$B_i$ is i-th bit map data;
$\oplus$ is an exclusive OR logic; and
$+$ is an OR logic.

This calculation can be also easily made by using suitable logic circuits.

Figure 20:
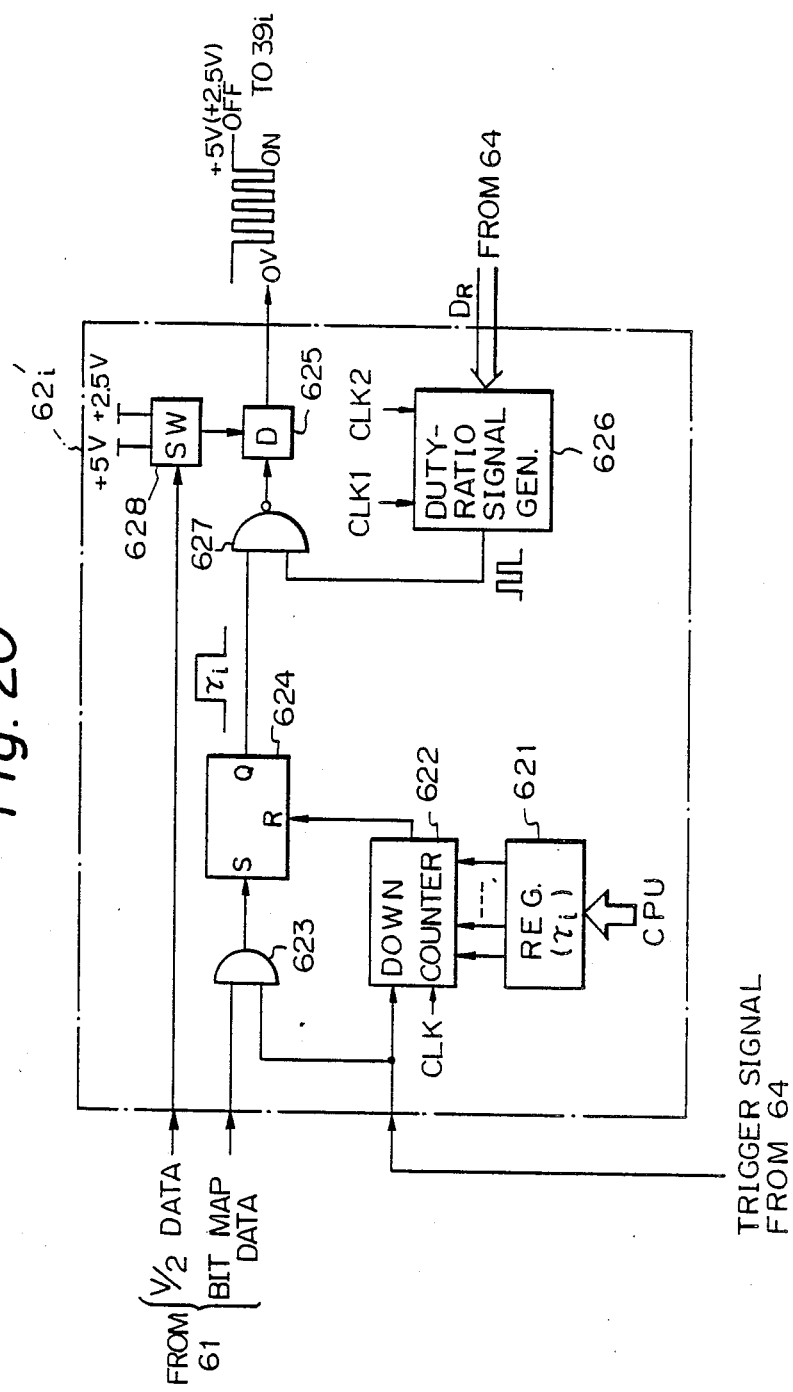
FIG. 20 is a block diagram of a modification of FIG. 14.

Note that the above-mentioned V/2 map data can also be stored in the bit map memory 61. In this case, the circuit $62_i'$ of FIG. 14A is modified as illustrated in FIG. 20. That is, in FIG. 20, a switch circuit 628 is added to the elements of FIG. 14A. The switch circuit 628 is controlled in accordance with the V/2 map data. If the V/2 map data is "0", the switch circuit 628 applies +5 V to the driver 625, while, if the V/2 map data is "1", the switch circuit 628 applies +2.5 V to the driver 625.

Also, note that the two voltages +5 V and +2.5 V applied to the switch circuit 628 can be other voltages.

Figure 21:
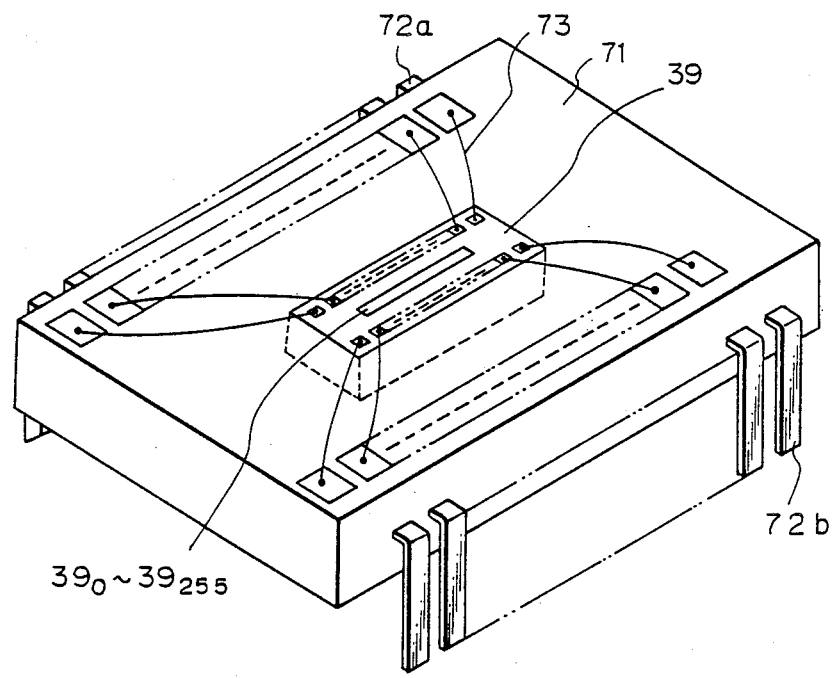
FIG. 21 is a perspective view of the entire blanking aperture array of FIG. 3.

The blanking apertures array 39 is explained with reference to FIG. 21. In FIG. 21, reference 71 designates an insulating substrate in which the blanking aperture array 39 is provided. External terminals 72a and 72b are provided on the periphery of the insulating substrate 71 and are connected by boding wires 73 to the blanking aperture array 39. A slit for the blanking apertures $39_0$ to $39_{255}$ of the blanking aperture array 39 has a length of about 480 μm and a width of about 10 μm.

The manufacturing steps of the blanking aperture array 39 are explained with reference to FIGS. 22A to 22G and FIGS. 23A to 23G which are plan views of FIGS. 22A to 22G, respectively.

Figure 22A:
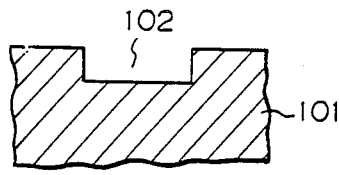
FIGS. 22A through 22G are cross-sectional views explaining the manufacture of the blanking aperture array of FIG. 21.
Figure 23A:
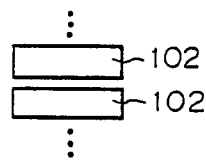
FIGS. 23A through 23G are plan views explaining the manufacture of the blanking aperture array of FIG. 21.

First, as illustrated in FIGS. 22A and 23A, grooves 102 are formed by the reactive ion etching (RIE) method in a substrate 101 which is, for example, made of monocrystalline silicon.

Figure 22B:
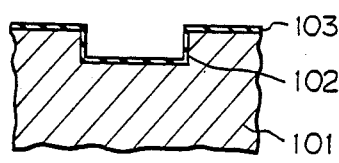
Figure 23E:
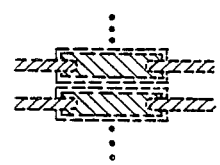
Figure 23B:
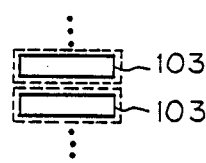

As illustrated in FIGS. 22B and 23B, a silicon dioxide (SiO$_2$) layer 103 is formed on the substrate 101 by the thermal oxidation method or the chemical vapor deposition (CVD) method.

Figure 22C:
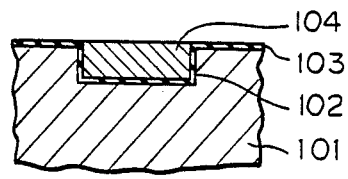
Figure 23F:
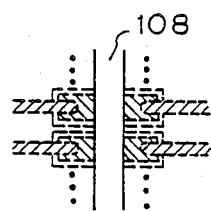
Figure 23C:
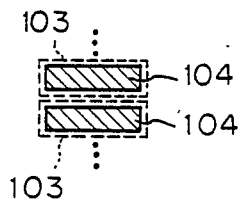
Figure 23G:
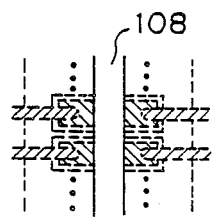

As illustrated in FIGS. 22C and 23C, tungsten (W) is deposited by the sputtering method on the SiO$_2$ layer 103, and then only the unnecessary portions are selectively removed by the RIE method. As a result, the tungsten layer 104 is formed only within the grooves 102. Note that the tungsten (W) layer 104 serves as the electrodes of the blanking apertures $39_0$ to $39_{255}$.

Figure 22D:
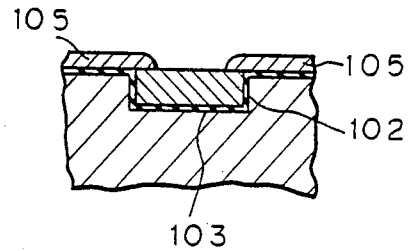
Figure 23D:
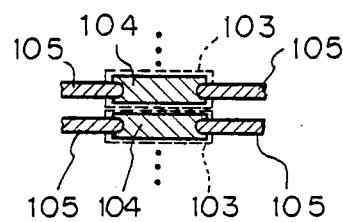

Next, as illustrated in FIGS. 22D and 23D, aluminum (Al) is deposited by the sputtering method on the entire surface of the device. Then, a the Al layer is patterned to obtain connection layers 105.

Figure 22E:
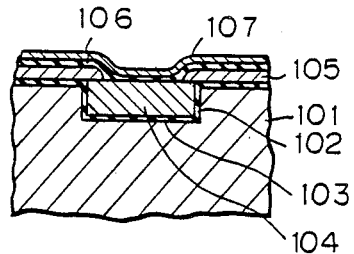

Next, as illustrated in FIGS. 22E and 23E, a SiO$_2$ layer 106 is deposited by the CVD method on the entire device, and then, an Al layer 107 is deposited thereon by the sputtering method. In this case, the contact portions (not shown) are formed by suitable etching on the SiO$_2$ layer 106 and the Al layer 107, for the connection of the bonding wires 73 (FIG. 21). Note that the Al layer 107 prevents the device from being charged up by electrons.

Figure 22F:
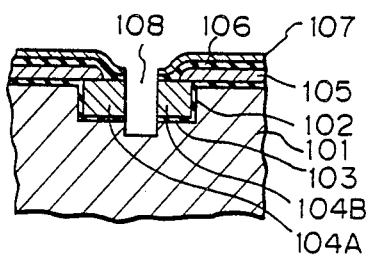
Figure 22G:
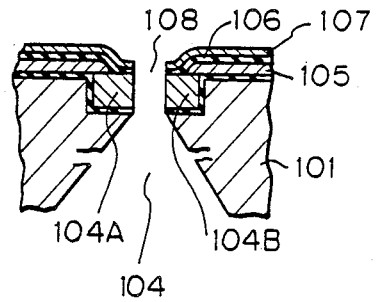

Next, as illustrated in FIGS. 22F and 23F, a groove 108 is formed by the RIE method within the substrate 101, the SiO$_2$ layer 102, the W layer 104, the SiO$_2$ layer 106, and the Al layer 107. In this case, the W layer 104 is divided into two portions 104A and 104B which serve as blanking electrodes.

Next, the back face of the substrate 101 is etched by the RIE method, creating an electron passing hole 109. Thus, the blanking aperture array 39 is completed.

With reference to FIGS. 22A to 22G and 23A to 23G, the substrate 101 can be made of insulating material and in such case, the insulating layer 103 may be omitted. Also, the layers 104 and 105 can be made of a single layer.

Figure 24A:
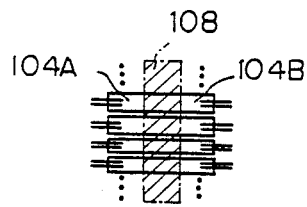
FIGS. 24a through 24G are plan views of modifications of the blanking aperture array of FIG. 21.
Figure 24B:
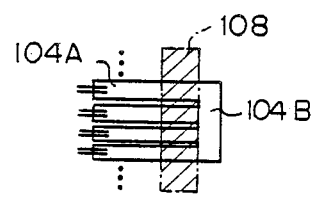
Figure 24C:
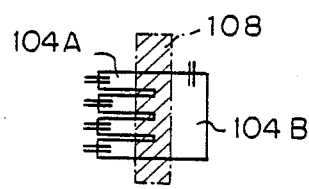
Figure 24D:
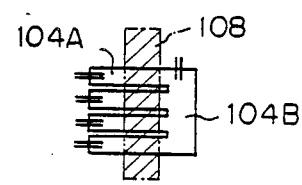
Figure 24E:
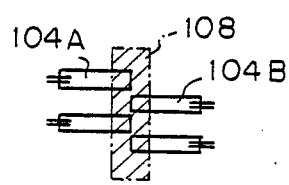
Figure 24F:
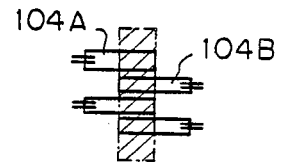
Figure 24G:
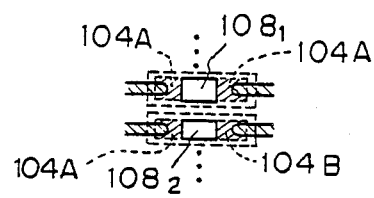

FIG. 24A corresponds to FIG. 23G, and FIGS. 24B through 24G illustrate modifications of FIGS. 24A. That is, in FIGS. 24B to 24D, the electrodes 104A are formed individually for each aperture, while the electrode 104B is formed commonly for all the apertures. Also, in FIGS. 24E and 24F, both of the electrodes 104A and 104B are formed individually for each aperture. Further, in FIG. 24G, actual apertures $108_1$, $108_2$, . . . are separate from each other.

Using the above-mentioned configurations, 256 beams that are 0.1 μm square are exposed on a resist at a current density of 200 A/cm$^2$ and at a sensitivity of 5 μC/cm$^2$ for a shot time period of 25 ns, and a scanning area having a width of 2 mm (40 MHZ) is continuously moved at a speed of 50 mm/s, thus obtaining an exposure speed of 1 cm$^2$/s.

As explained above, according to the present invention, also in a depiction for a fine-structured LSI such as a 0.2 to 0.3 μm-rule LSI, a stable exposure can be carried out at a high-speed, and with a high degree of accuracy.

We claim:

1. A charged particle beam exposure system for projecting a charged particle beam on a target (51) mounted on a stage (7), comprising:
   means (30) for emitting a charged particle beam;
   a blanking aperture array (39) for passing said charged particle beam, said array having a line of blanking apertures ($39_0$ to $39_{255}$) to each having electrode means; and
   means (62) for individually driving the electrode means of said blanking apertures in a manner such that the dose factor obtained by multiplying the intensity ($I_i$) of a charged particle beam passing through one of said blanking apertures and the ON-duty time period ($\tau_i$) of the electrode means of said one of said blanking apertures is constant.

2. A system as set forth in claim 1, further comprising means (20, 21) for moving said stage in parallelism with the line of said blanking apertures and said driving means (62) driving the electrode means so as to cause said charged particle beam to swing perpendicularly to the line of said blanking apertures.

3. A system as set forth in claim 2, further comprising:
   means (68) for detecting the position of said stage;

means (652) for calculating a stage error between the detected position of said stage and a predetermined position thereof;

deflection means (67, 49) for deflecting said charged particle beam which has passed through said blanking apertures along the motion direction of said stage so as to reduce said stage error.

4. A system as set forth in claim 1, further comprising flattening means for flattening the crossover into a line shape whenever said charged particle beam generated from said charged particle beam generating means forms a crossover by critical exposure.

5. A system as set forth in claim 5, wherein said smashing flattening means comprises a four-pole beam flattening lens.

6. A charged particle beam exposure system for projecting a charged particle beam on a target (52), comprising:

means (30) for emitting a charged particle beam;

a blanking aperture array (39) for passing said charged particle beam, said array having a line of blanking apertures ($39_0$ to $39_{255}$) each having electrode means;

means (62) for individually driving the electrode means of said blanking apertures; and means (64′) for controlling the ON-duty ratio of the electrode means of each of said blanking apertures in accordance with the exposure dose in close proximity thereto.

7. A system as set forth in claim 6, wherein the exposure dose in close proximity to one blanking aperture is determined by the area of a shot to which said one blanking aperture belongs.

8. A system as set forth in claim 6, further comprising means (628) for reducing the voltage applied to the electrode means of said blanking apertures driven by said electrode driving means on the outer sides thereof as compared with the others.

9. A system as set forth in claim 6, further comprising means (20, 21) for moving said target in parallelism with the line of said blanking apertures and said driving means (62) driving the electrode means so as to cause said charged particle beam to swing perpendicularly to the line of said blanking apertures.

10. A system as set forth in claim 9, further comprising:

means (68) for detecting the position of said target;

means (652) for calculating an error between the detected position of said target and a predetermined position thereof;

deflection means (67, 49) for deflecting said charged particle beam which has passed through said blanking apertures along the motion direction of said target so as to reduce said error.

11. A system as set forth in claim 6, further comprising flattening means for flattening the crossover into a line shape whenever said charged particle beam generated from said charged particle beam generating means forms a crossover by critical exposure.

12. A system as set forth in claim 11, wherein said means comprising a four-pole beam lens.

* * * * *

UNITED STATES PATENT AND TRADEMARK OFFICE
CERTIFICATE OF CORRECTION

PATENT NO. : 4,980,567

DATED : December 25, 1990                                Page 1 of 2

INVENTOR(S) : Hiroshi Yasuda, Junichi Kai, Toyotaka Kataoka,
              Yasushi Takahashi, Shinji Miyaki and Kiichi Sakamoto It is certified that error appears in the above-identified patent and that said Letters Patent is hereby corrected as shown below:

Column 1, line 26, "pattern" should be --patterns--;
         line 28, "deflectios" should be --deflections--;
         line 29, "a beam size deflection" should be
            --beam size deflections--;
         line 39, "beam" should be --beams--;
         line 40, delete "all";
         line 45, "delete "a", "width" should be --widths--;
         line 64, "the" should be --a--;
         line 65, "a" should be --the--.

Column 2, line 7, delete "the".

Column 3, line 31, "a" should be --aperture--;
         line 57 "the" (second occurrence) should be
            --this--;
         line 58, "this" should be --the--;
         line 65, delete "a".

Column 4, line 16, "beam" should be --beams--;
         line 34, "3" should be --1--.

Column 5, line 8, "X,,Y" should be --(X',Y')--;
         line 10, "opposite" should be --position--;
         line 13, "one-dimensioned" should be
            --one dimensional--;
         line 31, "8 8C," should be --8A, 8B, and 8C,--
         line 40, "intensity" should be --intensities--;
         line 59, "of" should be --from--;
         line 61, "and decreases" should be
            --to correspondingly decrease--;
         line 68, "of" should be --from--.
         line 67, delete "from" should be --Of--

UNITED STATES PATENT AND TRADEMARK OFFICE
CERTIFICATE OF CORRECTION

PATENT NO. : 4,980,567

DATED : December 25, 1990

INVENTOR(S) : Hiroshi Yasuda, Junichi Kai, Toyotaka Kataoka, Yasushi Takahashi, Shinji Miyaki and Kiichi Sakamoto It is certified that error appears in the above-identified patent and that said Letters Patent is hereby corrected as shown below:

Column 6, line 38, "for" should be --of--;
line 54, "shift is" should be --shift alone is--;
line 61, "system" should be --systems--.

Column 7, line 6, "A" should be --shot A--.

Column 8, equation on line 17, "$\Delta Ni$" should be --$\Delta N_i$--.

Column 9, equation on line 13 should be
--$A_i \leftarrow (B_i-1 \oplus B_i)+(B_i \oplus B_{i+1})$--.

Column 10, line 1, after "case" delete "the";
line 3, after "for" delete "the";
line 23, "FIGS." should be --FIG.--.

Column 11, line 13, delete "smashing";
line 17, "(52)" should be --(51)--.

Signed and Sealed this

First Day of September, 1992

Attest:

DOUGLAS B. COMER

Attesting Officer

Acting Commissioner of Patents and Trademarks